United States Patent
Richter et al.

(10) Patent No.: US 10,079,242 B2
(45) Date of Patent: Sep. 18, 2018

(54) LOGIC AND FLASH FIELD-EFFECT TRANSISTORS

(71) Applicant: GLOBALFOUNDRIES Inc., Grand Cayman (KY)

(72) Inventors: Ralf Richter, Radebeul (DE); Thomas Melde, Dresden (DE); Elke Erben, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/366,425

(22) Filed: Dec. 1, 2016

(65) Prior Publication Data

US 2018/0158835 A1  Jun. 7, 2018

(51) Int. Cl.
| | |
|---|---|
| H01L 29/10 | (2006.01) |
| H01L 27/11568 | (2017.01) |
| H01L 21/28 | (2006.01) |
| H01L 21/02 | (2006.01) |
| H01L 29/51 | (2006.01) |
| H01L 29/06 | (2006.01) |
| H01L 27/11573 | (2017.01) |
| H01L 21/033 | (2006.01) |

(Continued)

(52) U.S. Cl.
CPC .... H01L 27/11568 (2013.01); H01L 21/0217 (2013.01); H01L 21/02164 (2013.01); H01L 21/02236 (2013.01); H01L 21/02532 (2013.01); H01L 21/0332 (2013.01); H01L 21/28185 (2013.01); H01L 21/28282 (2013.01); H01L 21/84 (2013.01); H01L 27/11573 (2013.01); H01L 27/1203 (2013.01); H01L 29/0649 (2013.01); H01L 29/513 (2013.01); H01L 29/518 (2013.01)

(58) Field of Classification Search
CPC ....... H01L 21/823828; H01L 29/66545; H01L 29/6656; H01L 21/02381; H01L 21/0245; H01L 21/02532
See application file for complete search history.

(56) References Cited

U.S. PATENT DOCUMENTS

2004/0087114 A1* 5/2004 Xiang ................. H01L 29/1054
  438/478
2009/0072274 A1* 3/2009 Knoefler ............... H01L 27/105
  257/204

(Continued)

OTHER PUBLICATIONS

Kouznetsov et al., "Advances in Charge-Trap Nonvolatile Memory Technology", Leading Edge Embedded NVM Workshop, Gardanne, FR, Sep. 28-30, 2015.

*Primary Examiner* — Jaehwan Oh
(74) *Attorney, Agent, or Firm* — Thompson Hine LLP; Yuanmin Cai

(57) ABSTRACT

Methods of forming a device structure for a field-effect transistor and device structures for a field-effect transistor. A first gate dielectric layer is formed on a semiconductor layer in a first area. A hardmask layer is formed on the first gate dielectric layer in the first area of the semiconductor layer. A gate stack layer is formed on the semiconductor layer in a second area and on the hardmask layer in the first area of the semiconductor layer. The hardmask layer separates the gate stack layer from the first gate dielectric layer on the first area of the semiconductor layer.

19 Claims, 6 Drawing Sheets

(51) Int. Cl.
*H01L 21/84* (2006.01)
*H01L 27/12* (2006.01)

(56) References Cited

U.S. PATENT DOCUMENTS

2014/0319620 A1* 10/2014 Hoentschel ............. H01L 28/20
257/379
2017/0162570 A1* 6/2017 Shih .................... H01L 27/0922

* cited by examiner

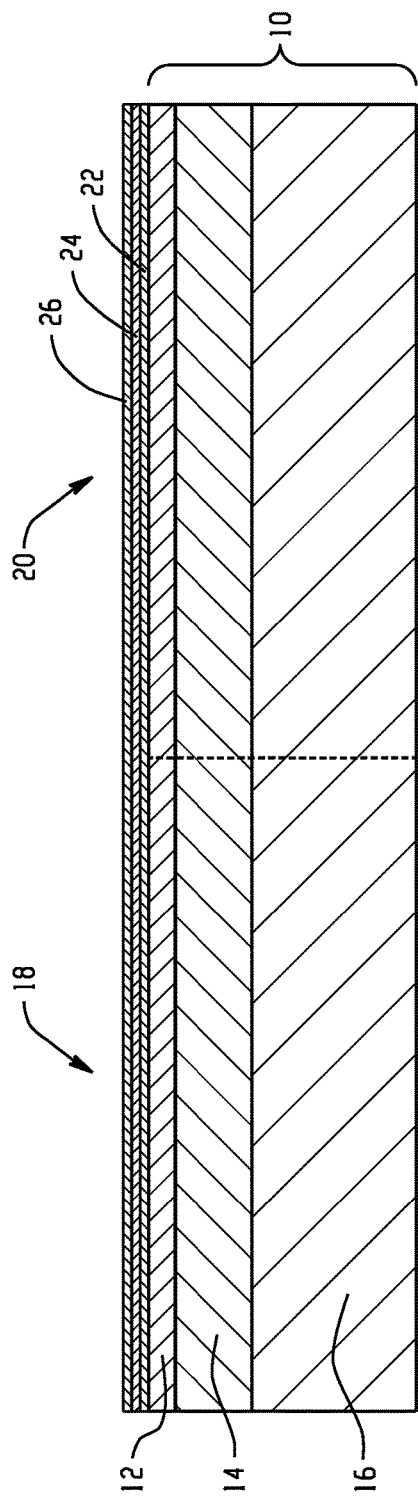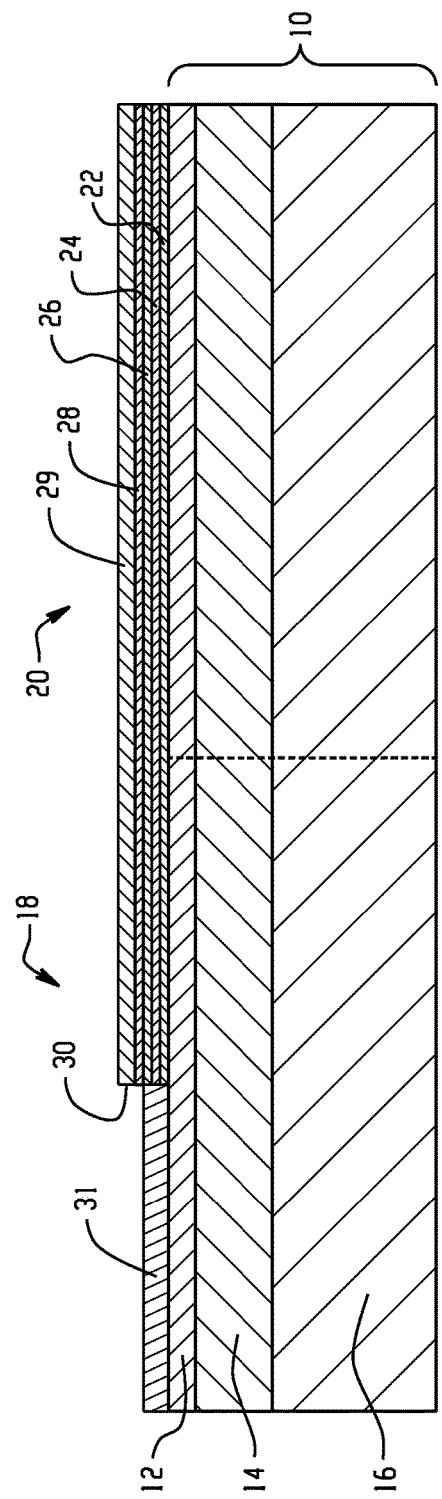

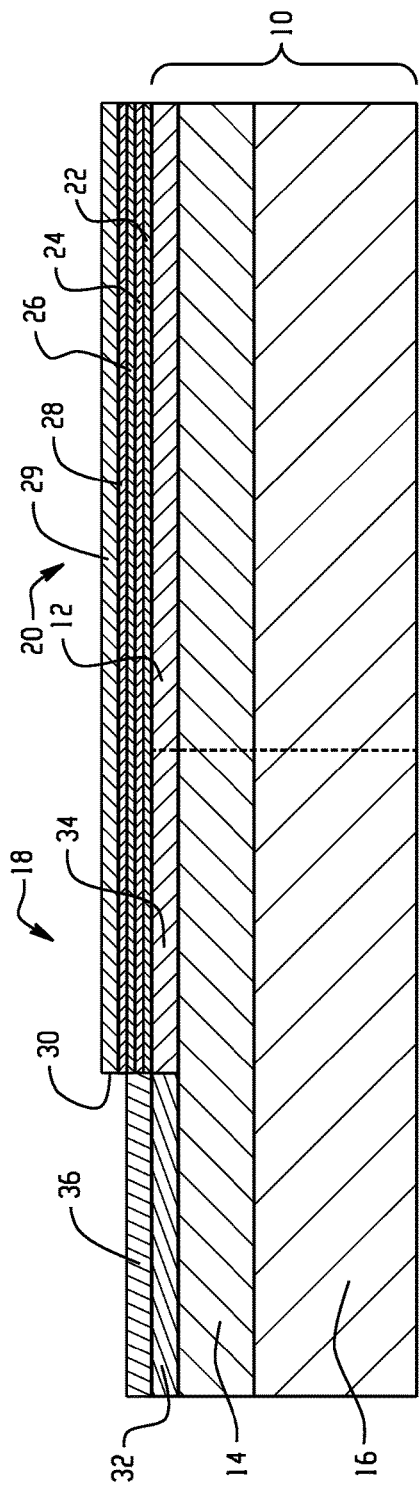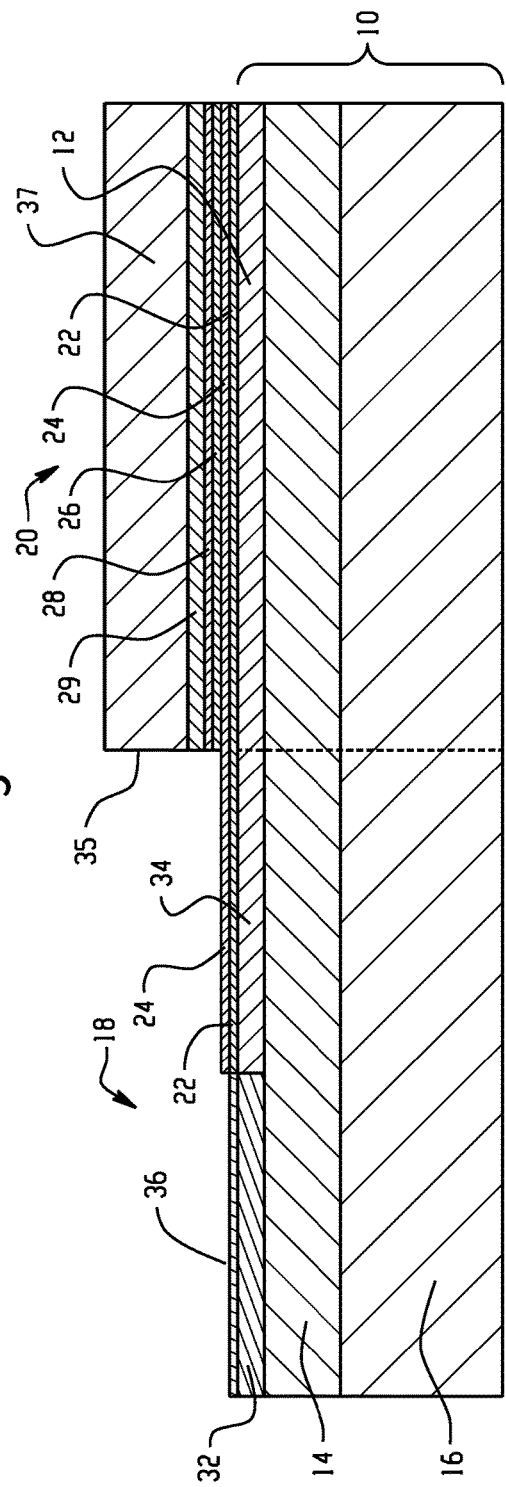

LOGIC AND FLASH FIELD-EFFECT TRANSISTORS

BACKGROUND

The invention relates generally to integrated circuits and, in particular, to methods of forming a device structure for a field-effect transistor and device structures for a field-effect transistor.

Complementary-metal-oxide-semiconductor (CMOS) processes may be used to build a combination of p-channel and n-channel field-effect transistors (nFETs and pFETS) that are coupled to implement logic gates and other types of circuits, such as switches. Field-effect transistors generally include an active semiconductor region, a source and a drain defined in the active semiconductor region, and a gate electrode. When a control voltage exceeding a characteristic threshold voltage is applied to the gate electrode, an inversion or depletion layer is formed in a channel defined in the active semiconductor region between the source and drain by the resultant electric field and carrier flow occurs between the source and drain to produce a device output current.

Semiconductor-on-insulator (SOI) substrates may be advantageous in CMOS technology. In comparison with field-effect transistors built using a bulk silicon wafer, a semiconductor-on-insulator substrate permits operation at significantly higher speeds with improved electrical isolation and reduced electrical losses. Contingent on the thickness of the device layer of the SOI substrate, a field-effect transistor may operate in a partially-depleted mode in which the depletion layer in the channel in the device layer does not extend fully to the buried oxide layer when typical control voltages are applied to the gate electrode.

Partially-depleted SOI field-effect transistors may be fabricated with two types, namely floating-body SOI field-effect transistors or body contacted SOI field-effect transistors. A floating-body SOI field-effect transistor conserves device area due to its comparatively small size, but suffers from the floating body effect due to the absence of a body contact. A floating-body SOI field-effect transistor may be unstable during operation, especially when operating in an RF circuit or a high speed digital circuit, because the threshold voltage is a function of a fluctuating body voltage. A body contacted SOI field-effect transistor includes a body contact that may eliminate body effects. However, a body contacted SOI field-effect transistor covers more chip area than a floating-body SOI field-effect transistor, which reduces the density of a circuit built using body contacted SOI field-effect transistors in comparison with a circuit built using floating-body SOI field-effect transistors.

Improved methods of forming a device structure for a field-effect transistor and device structures for a field-effect transistor are needed.

SUMMARY

In an embodiment of the invention, a method includes forming a first gate dielectric layer on a semiconductor layer in a first area, forming a hardmask layer on the first gate dielectric layer in the first area of the semiconductor layer, and forming a gate stack layer on the semiconductor layer in a second area and on the hardmask layer in the first area of the semiconductor layer with the hardmask layer separating the gate stack layer from the first gate dielectric layer on the first area of the semiconductor layer.

In an embodiment of the invention, a device structure includes a semiconductor layer, a first gate stack on the semiconductor layer, and a second gate stack on the semiconductor layer. The first gate layer includes a metal gate electrode and a high-k dielectric layer. The second gate stack includes a polysilicon gate electrode and a plurality of dielectric layers. A section of a hardmask layer is located between the metal gate electrode of the first gate stack and the polysilicon gate electrode of the second gate stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 1-8 are cross-sectional views of a portion of a substrate illustrating successive stages of a fabrication process forming a device structure in accordance with embodiments of the invention.

DETAILED DESCRIPTION

Figure 5:
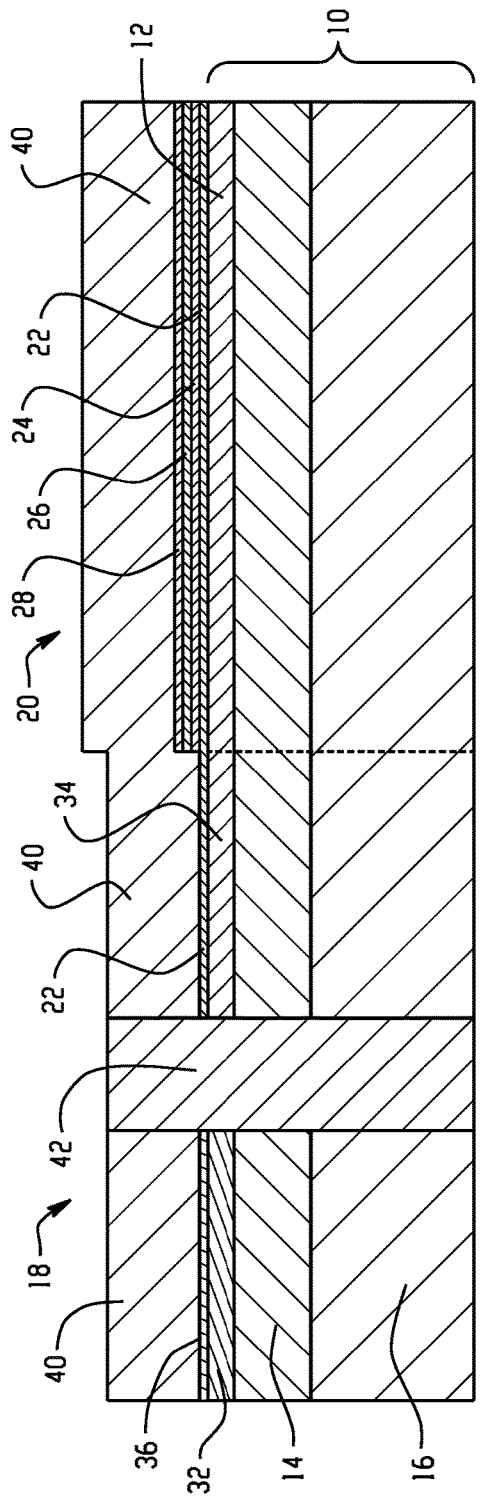

With reference to FIG. 1 and in accordance with an embodiment of the invention, a substrate 10 in the representative form of a semiconductor-on-insulator (SOI) substrate includes a device layer 12, a buried dielectric layer in the form of a buried oxide (BOX) layer 14 comprised of an oxide of silicon (e.g., $SiO_2$), and a handle wafer 16. The device layer 12 is separated from the handle wafer 16 by the intervening BOX layer 14 and is considerably thinner than the handle wafer 16. The device layer 12 and the handle wafer 16 may be comprised of a single crystal semiconductor material, such as silicon. In one embodiment, the device layer 12 may be extremely thin (i.e., a thickness of 2 nm to 15 nm) characteristic of extremely thin semiconductor on insulator (ETSOI) substrate that may be used to manufacture fully-depleted SOI devices (FDSOI). The BOX layer 14 has a surface in direct contact with the handle wafer 16 along an interface and another surface in direct contact with the device layer 12 along another interface, and these surfaces are separated by the thickness of the BOX layer 14 that terminates at the rim of the substrate 10. The device layer 12 is electrically isolated from the handle wafer 16 by the BOX layer 14. The handle wafer 16 may be lightly doped to have, for example, p-type conductivity.

The device layer 12 and the substrate 10 may be considered to have a device area 18 and a device area 20. The device area 18 will be used in the process flow to fabricate logic devices, and the device area 20 will be used in the process flow to fabricate flash memory devices. The device area 18 may be implanted to provide p-wells and n-wells (not shown) needed for subsequent device formation.

Gate dielectric layers 22, 24, 26 are formed on a top surface of device layer 12. The materials forming the gate dielectric layers 22, 24, 26 may be chosen to etch selectively to the semiconductor material constituting the device layer 12 and configured to be readily removed at a subsequent fabrication stage. Gate dielectric layer 22 may be composed of a dielectric material, such as silicon dioxide ($SiO_2$), grown by oxidizing the top surface of device layer 12 or deposited by chemical vapor deposition (CVD). Gate dielectric layer 24 may be composed of a dielectric material, such as silicon nitride ($Si_3N_4$) deposited by CVD. Gate dielectric layer 26 may be composed of a dielectric material, such as silicon dioxide ($SiO_2$), deposited by CVD. In an embodiment, the gate dielectric layers 22, 26 may be composed of the same dielectric material, such as silicon dioxide ($SiO_2$), deposited by CVD.

With reference to FIG. 2 in which like reference numerals refer to like features in FIG. 1 and at a subsequent fabrication stage, layers 28, 29 of a hardmask are formed on a top surface of the gate dielectric layer 26. Hardmask layer 28 may be composed of a dielectric material, such as silicon dioxide ($SiO_2$), deposited by CVD, and hardmask layer 29 may be composed of a dielectric material, such as silicon nitride ($Si_3N_4$), deposited by CVD. In an embodiment, the hardmask layer 28 may be composed of the same dielectric material, such as silicon dioxide ($SiO_2$), as the gate dielectric layer 26.

The hardmask layers 28, 29 and the gate dielectric layers 22, 24, 26 are removed from the top surface of the device layer 12 over an opened area 30 constituting a portion of the device area 20. An epitaxial semiconductor layer 31 is formed on the top surface of the device layer 12 across the opened area 30 of the device layer 12. In an embodiment, the epitaxial semiconductor layer 31 may contain germanium and, in particular, may be comprised of silicon-germanium (SiGe) deposited by chemical vapor deposition (CVD) and having a germanium concentration (i.e., the ratio of the germanium content to the germanium and silicon content) ranging from 2% to 50%. The epitaxial semiconductor layer 31 may be formed using an epitaxial growth process, such as a selective epitaxial growth process in which the constituent semiconductor material nucleates for epitaxial growth on semiconductor surfaces, but does not nucleate for epitaxial growth on insulator surfaces (e.g., the top surface of the hardmask layer 29).

With reference to FIG. 3 in which like reference numerals refer to like features in FIG. 2 and at a subsequent fabrication stage, a section 32 of the device layer 12 in the device area 18 and nominally coinciding with the area covered by the epitaxial semiconductor layer 31 (FIG. 3) is modified in its composition using thermal condensation. The processed section 32 of device layer 12 extends from the top surface of the device layer 12 to the BOX layer 14 and is in direct contact with the BOX layer 14. In other words, the entire thickness of the device layer 12 is locally modified by the thermal condensation over its surface area that is in contact with the epitaxial semiconductor layer 31 across opened area 30 to form the processed section 32 that has a different composition than the nearby unprocessed sections of the device layer 12. In particular, an unprocessed section 34 of the device layer 12 is located between the processed section 32 of the device layer 12 in device area 18 and the device layer 12 in device area 20.

Thermal condensation is a thermal process that causes germanium atoms to be transported (e.g., diffuse) from the epitaxial semiconductor layer 31 into the section 32 of the device layer 12. Thermal condensation may be performed using a rapid thermal annealing process with the substrate 10 held in an oxygen-containing ambient. During oxidation, the epitaxial semiconductor layer 31 oxidizes across its thickness beginning at its top surface and advancing toward the interface with the section 32 of the device layer 12. Germanium atoms are irreversibly transported from the epitaxial semiconductor layer 31 into the section 32 of the device layer 12 as oxidation proceeds. Thermal condensation is based on, among other factors, germanium and silicon each having diamond lattice structures, and the different chemical affinities between germanium and silicon with respect to oxygen.

The hardmask layers 28, 29, which are oxygen impermeable, protect the gate dielectric layers 22, 24, 26 in device area 20 and, where covered, in device area 18 during the performance of the thermal condensation process. The end result of thermal condensation is that the epitaxial semiconductor layer 31 is converted to an oxidized remnant layer 36 depleted of germanium (e.g., silicon dioxide ($SiO_2$)), and the processed section 32 of the device layer 12 receiving the germanium is converted to a germanium-enriched semiconductor material (i.e., SiGe) that retains the single crystal state of the initial semiconductor material from which the device layer 12 is composed. The BOX layer 14 rejects the diffusion of germanium such that the germanium displaced from the epitaxial semiconductor layer is located entirely in the processed section 32 of device layer 12. Following the thermal process, the oxidized remnant layer 36, which has a composition depleted of germanium by the thermal process, may be partially removed, such as by etching, for example, using a dilute hydrofluoric acid (HF).

The germanium concentration in the processed section 32 of device layer 12 depends on, among other factors, the thickness and composition of the device layer 12, and the germanium content and thickness of the epitaxial semiconductor layer 31. In an embodiment, the processed section 32 of device layer 12 may be initially composed of silicon and may be converted by thermal condensation into a silicon-germanium alloy with a germanium concentration reflecting the germanium content of the epitaxial semiconductor layer 31. The processed section 32 of device layer 12 may incorporate compressive strain due to a change to its crystal structure induced by germanium introduced during the thermal condensation process. Germanium atoms located at lattice sites in the crystal structure of the semiconductor material constituting the device layer 12 having the modified composition and have a larger atomic size than, for example, silicon atoms. Generally, the lattice constant of a silicon-germanium alloy is slightly larger than the lattice constant of silicon.

With reference to FIG. 4 in which like reference numerals refer to like features in FIG. 3 and at a subsequent fabrication stage, an etch mask 37 is formed on the top surface of the device layer 12 that covers the device area 20. The etch mask 37 may be comprised of a layer of a photo-sensitive material, such as an organic photoresist, that may be applied as a fluid by a spin coating process, pre-baked, exposed to light projected through a photomask, baked after exposure, and developed with a chemical developer. The patterning of the etch mask 37 defines an opening 35 that coincides with the device area 20.

The hardmask layer 29 may be removed from the top surface of the device layer 12 in device area 18 using, for example, a chemical etching process that stops on the hardmask layer 28 and that removes the hardmask layer 29 selective to the oxidized remnant layer 36. The top surface of the gate dielectric layer 26 is thereby exposed in device area 18 for further processing. The gate dielectric layer 26 is removed from device area 18 selective to the gate dielectric layer 24 and, during its removal, the oxidized remnant layer 36 is partially removed by the same etching process. The gate dielectric layers 22, 24, 26 in device area 20 are protected against damage by the etch mask 37 and the underlying hardmask layers 28, 29.

With reference to FIG. 5 in which like reference numerals refer to like features in FIG. 4 and at a subsequent fabrication stage, the etch mask 37 is stripped to expose the hardmask layers 28, 29 covering the device area 20. The gate dielectric layer 24 remaining on the unprocessed section 34 of the device area 18 and the hardmask layer 29 are then simultaneously removed selective to the gate dielectric layer 22 and the oxidized remnant layer 36. The gate dielectric layer 22 is exposed, as is the hardmask layer 28, and the oxidized remnant layer 36 and the gate dielectric layer 22 have nominally the same thickness across the entire device area 18.

A hardmask layer 40 is applied on both of the device areas 18, 20. The hardmask layer 40 may be composed of a dielectric material, such as silicon nitride ($Si_3N_4$), deposited by CVD. The hardmask layer 40 is removed from device area 18 using an etching process with the device area 20 masked by an etch mask, which creates a vertical edge 41 at the juncture of the device area 18 with the device area 20.

A trench isolation region 42 is formed in a trench that penetrates through the hardmask layer 40, the gate dielectric layer 22 and the thinned oxidized remnant layer 36, the device layer 12, and the BOX layer 14, and extends to a given depth into the substrate 10. The trench isolation region 42 is located at the junction of the processed section of the device layer 12 in device area 18 and the unprocessed section 34 of the device layer 12 in device area 18. The trench isolation region 42 may be formed by a shallow trench isolation (STI) technique in which trenches are formed and then filled with an electrical insulator by depositing a layer of the electrical insulator and then planarizing with, for example, CMP. The trench isolation region 42 may be comprised of a dielectric material, such as an oxide of silicon (e.g., silicon dioxide ($SiO_2$)) deposited by CVD. Additional trench isolation regions (not shown) may be formed in the device area 20.

Figure 6:
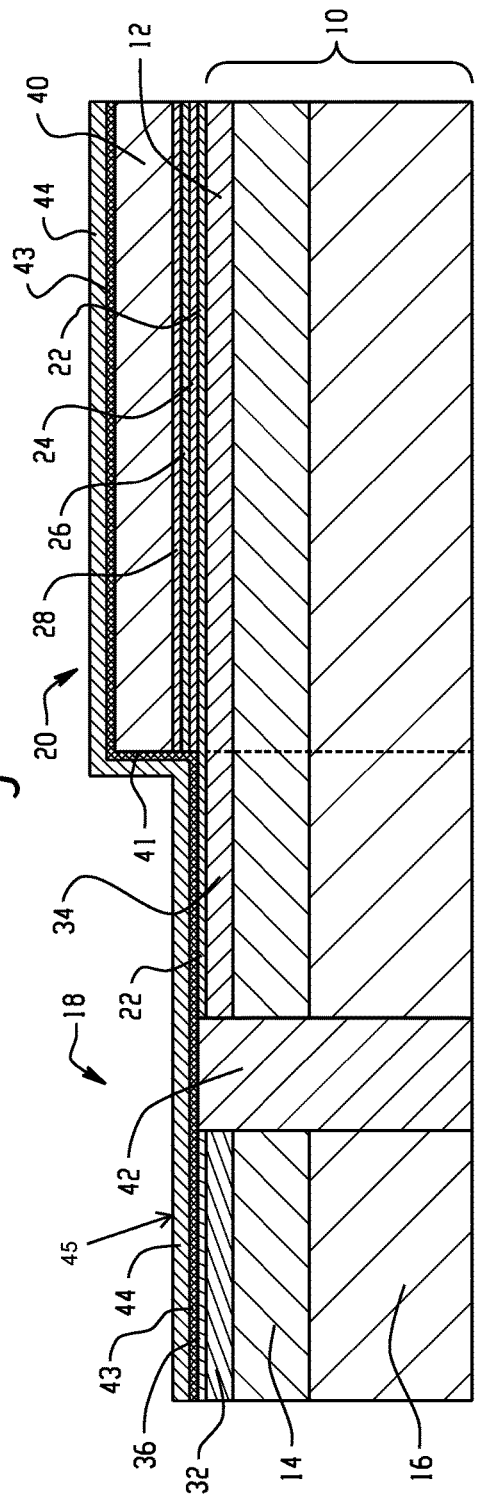

With reference to FIG. 6 in which like reference numerals refer to like features in FIG. 5 and at a subsequent fabrication stage, the trench isolation region 42 is recessed selective to the hardmask layer 40 by an etch-back process and the hardmask layer 40 is removed in the device area 18. A gate stack layer 45 is deposited on the gate dielectric layer 22 and the thinned oxidized remnant layer 36 in device area 18, as well as on the hardmask layer 40 in device area 20 and across the trench isolation region 42. The gate stack layer 45 may include a gate electrode layer 44 comprised of a metal, such as aluminum or tungsten, deposited by physical vapor deposition (PVD), CVD, etc., and may also include one or more work function metal layers present to adjust the threshold voltage. The gate stack layer 45 may include a gate dielectric layer 43 may be comprised of an electrical insulator, such as a high-k dielectric material such as hafnium oxide or hafnium oxynitride, deposited by CVD, ALD, etc.

The hardmask layer 40 functions as a protective coating on the gate dielectric layers 22, 24, 26 in the device area 20. In particular, the hardmask layer 40 separates the gate stack layer 45 from the gate dielectric layers 22, 24, 26 during the processes depositing the gate stack layer 45.

Figure 7:
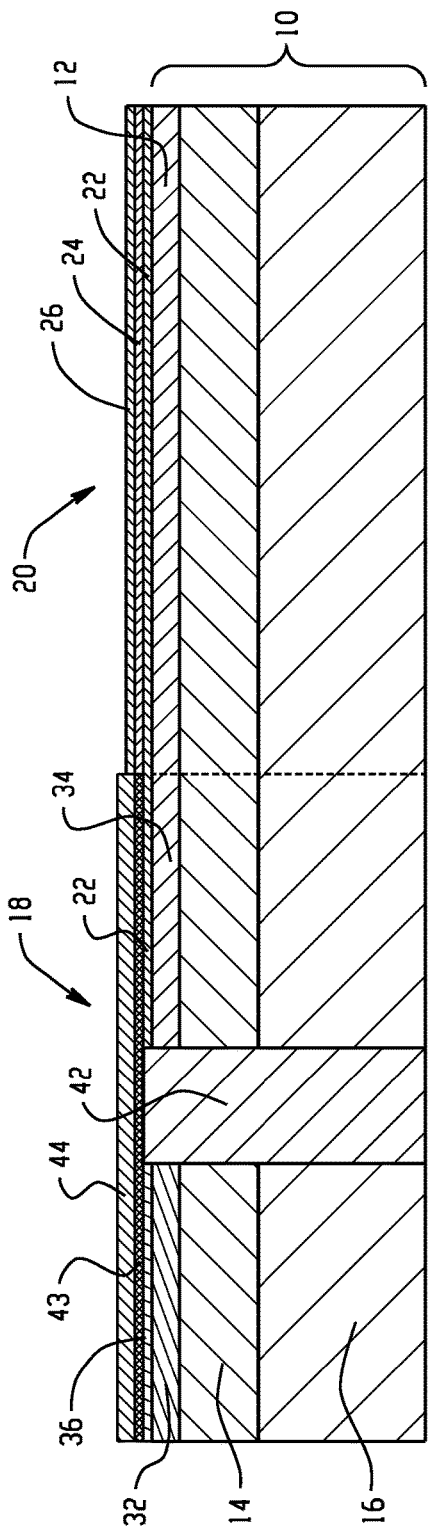

With reference to FIG. 7 in which like reference numerals refer to like features in FIG. 6 and at a subsequent fabrication stage, the section of the gate stack layer 45 in device area 18 is masked by an etch mask (not shown), and the section of the gate stack layer 45 in device area 20 coating the hardmask layer 40 is exposed by the etch mask for removal with an etching process. While the section of the gate stack layer 45 in device area 18 is still masked by the etch mask, the hardmask layer 40 is removed from the device area 20 to expose the hardmask layer 28. Following removal of the hardmask layer 40, the hardmask layer 28 and gate dielectric layer 26, which are comprised of the same electrical insulator, may be thinned to provide a targeted thickness. The etch mask may then be stripped.

Figure 8:
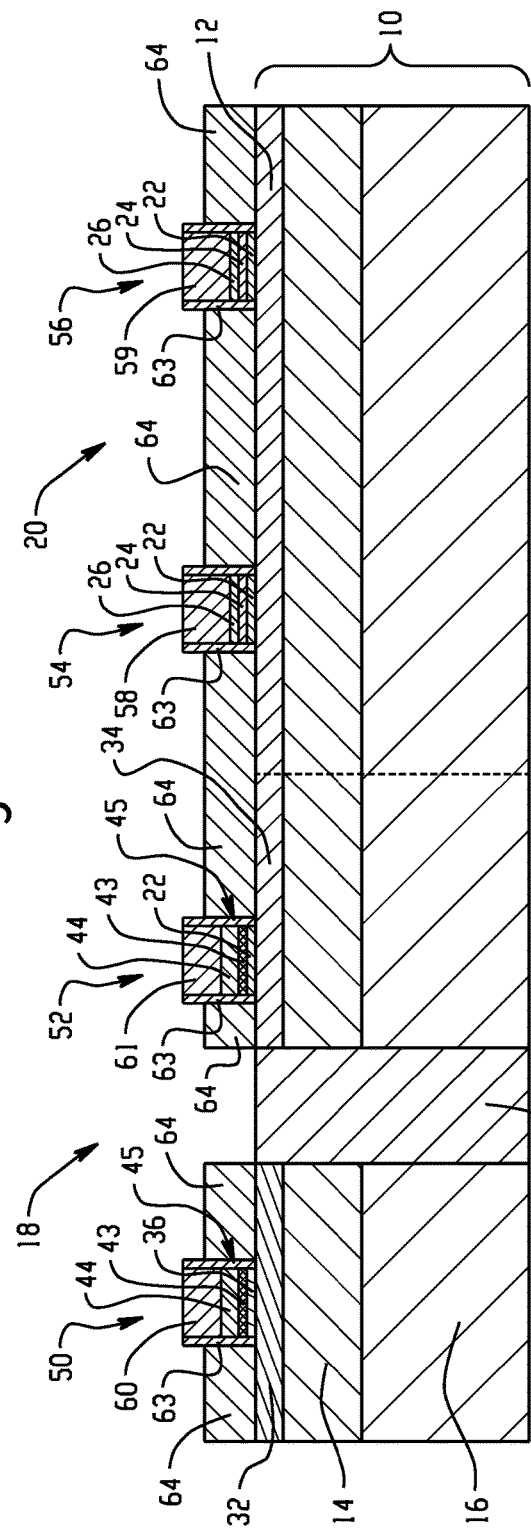

With reference to FIG. 8 in which like reference numerals refer to like features in FIG. 7 and at a subsequent fabrication stage, transistors 50, 52 are completed by additional processing in the device area 18 and transistors 54, 56 are completed by additional processing in the device area 20. To that end, a layer of doped polysilicon may be deposited and patterned to form respective gate electrodes 58, 59 for the transistors 54, 56 and to form low resistance layers 60, 61 on the sections of the gate stack layer 45 included in transistors 50, 52. When the gate electrodes 58, 59 and the low resistance layers 60, 61 are patterned, the gate electrode layer 44 may be patterned to define respective gate electrodes for the transistors 50, 52, the gate dielectric layer 43 may be patterned to define respective gate dielectrics for the transistors 50, 52, the oxidized remnant layer 36 may be patterned to shape an interface layer for the transistor 50, the oxidized remnant layer 36 may be patterned to form an interface layer for the transistor 52, and the gate dielectric layers 22, 24, 26 may likewise be patterned to define gate dielectrics for the transistors 54, 56.

The transistor 50 includes the processed section 32 of device layer 12 as a channel beneath a gate stack including the gate electrode patterned from gate electrode layer 44 and the gate dielectric patterned from gate dielectric layer 43. The patterned section of the oxidized remnant layer 36 serves as an interface layer between the gate stack included in transistor 50 and the underlying channel in the processed section 32 of the device layer 12. The transistor 52 includes the unprocessed section 34 of device layer 12 as a channel beneath a gate stack including the gate electrode patterned from gate electrode layer 44 and the gate dielectric patterned from gate dielectric layer 43. The patterned section of the gate dielectric layer 22 serves as an interface layer between the gate stack included in transistor 52 and the underlying channel in the processed section 32 of the device layer 12.

The transistors 54, 56 each include a unique section of the device layer 12 beneath the respective gate electrodes 58, 59 as a channel. The arrangement of the gate dielectric layers 22, 24, 26 of the transistors 54, 56 define respective SONOS memory cells in that the addition of gate dielectric layer 24 between gate dielectric layer 22 and gate dielectric layer 26 may contain a large number of charge trapping sites able to hold an electrostatic charge. The gate dielectric layer 24 is electrically isolated by the gate dielectric layers 22, 24 such that charge stored on the gate dielectric layer 24 directly affects the conductivity of the underlying channel in the device layer 12. The transistors 54, 56 do not include the gate dielectric layer 43 and the gate electrode layer 44 from the gate stack layer 45 due to the block mask afforded by the hardmask layer 40.

Spacers 63 may be formed on the vertical sidewalls of the gate structures of the transistors 50, 52, 54, 56. Source/drain regions 64 are formed adjacent to the vertical sidewalls of the gate structures of the transistors 50, 52, 54, 56 and are separated from the gate structures by the spacers 63. The spacers 63 may comprised of a dielectric material, such as SIOCN. The source/drain regions 64 may be comprised of a semiconductor material, such as silicon germanium (SiGe) or silicon (Si), formed by epitaxial growth process, and may include in situ doping during growth to impart a given conductivity type to the grown semiconductor material.

Standard middle-of-line (MOL) processing and back-end-of-line (BEOL) processing follows, which includes formation of dielectric layers, via plugs, and wiring for an interconnect structure coupled with the transistors 50, 52, 54, 56.

Figure 9:
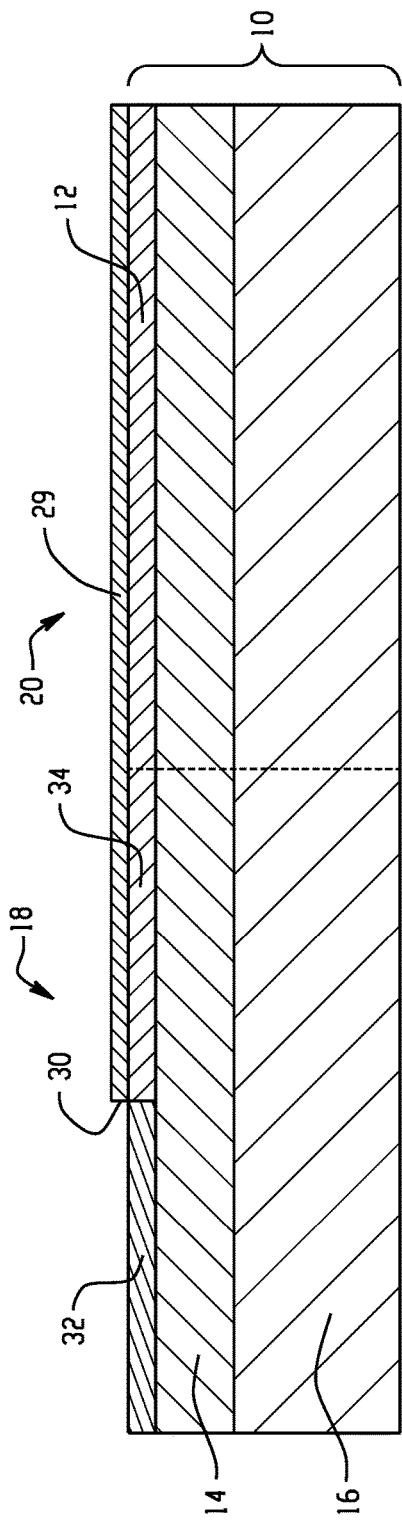
FIGS. 9-11 are cross-sectional views of a portion of a substrate illustrating successive stages of a fabrication process forming a device structure in accordance with embodiments of the invention.

With reference to FIG. 9 and in accordance with embodiments of the invention, the hardmask layer 29 may be applied on the device layer 12, and patterned to form the opened area 30, which extends to the top surface of the device layer 12 in the device area 20. The processed section 32 of device layer 12 is formed as described in the context of FIG. 3. After the processed section 32 of device layer 12 is formed, the oxidized remnant layer 36 is removed with, for example, an etch using a hydrofluoric acid solution. The hardmask layer 29 may be stripped after the oxidized remnant layer 36 is removed.

Figure 10:
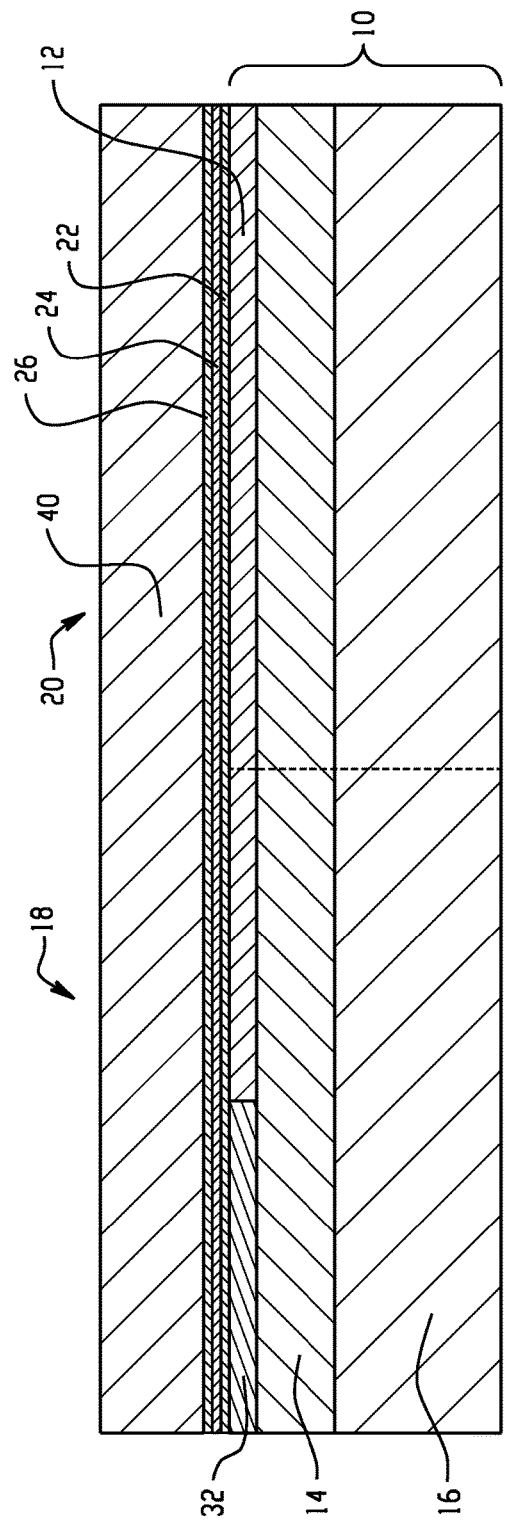

With reference to FIG. 10 in which like reference numerals refer to like features in FIG. 9 and at a subsequent fabrication stage, the gate dielectric layers 22, 24, 26 are deposited as described in the context of FIG. 1. The formation of the gate dielectric layers 22, 24, 26 occurs after the processed section 32 of device layer 12 is formed in device area 18. The hardmask layer 40 may be applied across both of the device areas 18, 20 such that the gate dielectric layers 22, 24, 26 are covered and protected.

Figure 11:
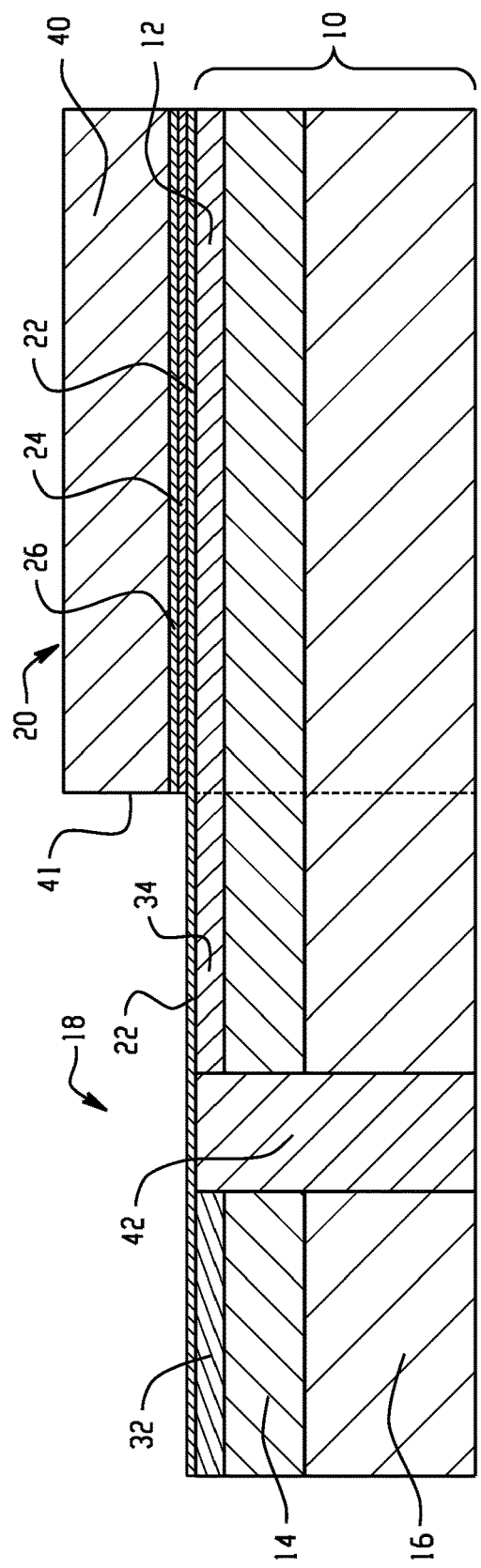

With reference to FIG. 11 in which like reference numerals refer to like features in FIG. 10 and at a subsequent fabrication stage, the hardmask layer 40 is removed from device area 18 using an etching process with the device area 20 masked by an etch mask. The trench isolation region 42 is formed at the junction of the processed section of the device layer 12 in device area 18 and the unprocessed section 34 of the device layer 12 in device area 18.

Processing continues as described in the context of FIGS. 6-8 to form the device structure of FIG. 8.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
  forming a first gate dielectric layer on a semiconductor layer in a first area;
  depositing a silicon-germanium layer on a section of the semiconductor layer in a second area;
  oxidizing the silicon-germanium layer to transport germanium from the silicon-germanium layer into the section of the semiconductor layer in the second area;
  after oxidizing the silicon-germanium layer, forming a hardmask layer over the first gate dielectric layer in the first area of the semiconductor layer; and
  forming a gate stack layer over the second area of the semiconductor layer and on the hardmask layer in the first area of the semiconductor layer,
  wherein the hardmask layer separates the gate stack layer from the first gate dielectric layer on the semiconductor layer in the first area.

2. The method of claim 1 wherein the silicon-germanium layer is oxidized after the first gate dielectric layer is formed.

3. The method of claim 2 wherein the first gate dielectric layer is formed on the semiconductor layer in the second area, and further comprising:
  before oxidizing the silicon-germanium layer, removing the first gate dielectric layer from the section of the semiconductor layer in the second area.

4. The method of claim 3 wherein the silicon-germanium layer is converted to a silicon dioxide layer by the oxidation, and further comprising:
  reducing a thickness of the silicon dioxide layer; and
  after the thickness is reduced, forming a gate structure of a field-effect transistor from the gate stack layer on the silicon dioxide layer.

5. The method of claim 1 wherein the silicon-germanium layer is oxidized before the first gate dielectric layer is formed.

6. The method of claim 5 wherein the silicon-germanium layer is converted to a silicon dioxide layer by the oxidation, and further comprising:
  removing the silicon dioxide layer,
  wherein the first gate dielectric layer is formed on the section of the semiconductor layer in the second area.

7. The method of claim 5 further comprising: forming a gate structure of a field-effect transistor from the gate stack layer on the first gate dielectric layer.

8. The method of claim 1 further comprising:
  before the hardmask layer is formed, forming a second gate dielectric layer on the first gate dielectric layer and a third gate dielectric layer on the second gate dielectric layer.

9. The method of claim 8 wherein the first gate dielectric layer is comprised of silicon dioxide, the second gate dielectric layer is comprised of silicon nitride, and the third gate dielectric layer is comprised of silicon dioxide.

10. The method of claim 1 further comprising:
after the first gate dielectric layer is formed, forming a trench isolation region in the semiconductor layer and extending through the hardmask layer.

11. The method of claim 10 wherein the hardmask layer is formed before the trench isolation region is formed and masks the first dielectric layer during the formation of the trench isolation region.

12. The method of claim 1 further comprising:
removing the gate stack layer and the hardmask layer from the first area of the semiconductor layer; and
forming a gate structure of a field-effect transistor over the first gate dielectric layer in the first area of the semiconductor layer.

13. The method of claim 1 further comprising:
forming a gate structure of a field-effect transistor from the gate stack layer over the second area of the semiconductor layer.

14. The method of claim 1 wherein the first gate dielectric layer is formed on the second area of the semiconductor layer, and further comprising:
removing the first gate dielectric layer from the second area of the semiconductor layer before the gate stack layer is formed.

15. The method of claim 1 wherein the first gate dielectric layer is formed on the second area of the semiconductor layer, and the gate stack layer is formed on the first gate dielectric layer in the second area of the semiconductor layer.

16. The method of claim 1 wherein the first gate dielectric layer is formed on the second area of the semiconductor layer, and further comprising:
before the hardmask layer is formed, forming a second gate dielectric layer on the first gate dielectric layer in the first area of the semiconductor layer and in the second area of the semiconductor layer.

17. The method of claim 16 further comprising:
after the hardmask layer is formed, removing the second gate dielectric layer from the second area of the semiconductor layer; and
before the gate stack layer is formed, thinning the first gate dielectric layer in the second area of the semiconductor layer to form an interface layer between the semiconductor layer and the gate stack layer.

18. The method of claim 1 wherein the semiconductor layer is a device layer of a silicon-on-insulator substrate.

19. The method of claim 1 wherein the gate stack layer includes a metal gate layer and a high-k dielectric layer.

* * * * *